United States Patent [19]
Chiang et al.

[11] Patent Number: 5,613,102
[45] Date of Patent: Mar. 18, 1997

[54] METHOD OF COMPRESSING DATA FOR USE IN PERFORMING VLSI MASK LAYOUT VERIFICATION

[75] Inventors: Kuang-Wei Chiang, Easton, Pa.; Chi-Yuan Lo, Basking Ridge; Doowan Paik, Scotch Plains, both of N.J.; Shun-Lin Su, Macungie, Pa.

[73] Assignee: Lucent Technologies Inc., Murray Hill, N.J.

[21] Appl. No.: 545,109

[22] Filed: Oct. 19, 1995

Related U.S. Application Data

[63] Continuation of Ser. No. 159,403, Nov. 30, 1993, abandoned.

[51] Int. Cl.$^6$ ........................................ G06F 17/50
[52] U.S. Cl. .................. 395/500; 364/260.6; 364/260.4; 364/275.6; 364/DIG. 1
[58] Field of Search ............................. 395/375, 800, 395/500; 364/490, 491

[56] References Cited

U.S. PATENT DOCUMENTS

| | | | |
|---|---|---|---|
| 4,179,824 | 12/1979 | Marsh | 395/127 |
| 4,908,772 | 3/1990 | Chi | 364/491 |
| 4,922,432 | 1/1990 | Kobayashi et al. | 364/490 |
| 5,097,422 | 3/1992 | Corbin, II et al. | 364/491 |
| 5,299,139 | 3/1994 | Baisuck et al. | 364/491 |
| 5,325,476 | 6/1994 | Takii et al. | 395/141 |

OTHER PUBLICATIONS

K. W. Chiang, et al. "Time–Efficient VLSI Art–Work Analysis Algorithms in GOALIE2", IEEE Transactions on CAD, vol. 81 No. 5, pp. 640–647, Jun. 1989.

T. Szymanski, et al. Special Feature: "Goalie: A Space Efficient System for VLSI Artwork Analysis", IEEE Design of Test, pp. 64–72, Jun., 1985.

*Primary Examiner*—Kevin J. Teska
*Assistant Examiner*—Ayni Mohamed

[57] ABSTRACT

A method of compressing data used in integrated circuit (IC) layout verifications includes the steps of identifying each circuit component from each layer of the IC chip; sorting each circuit component in an established order; identifying predetermined parameters for each component; determining the difference in value of the parameters for each pair of components in successive order; and storing the difference values for each pair of components.

7 Claims, 3 Drawing Sheets

METHOD OF COMPRESSING DATA FOR USE IN PERFORMING VLSI MASK LAYOUT VERIFICATION

This application is a continuation of application Ser. No. 08/159,403, filed on Nov. 30, 1993, and now abandoned.

The present invention is directed to a method of compressing data and, more particularly, to a method of compressing data used to perform integrated circuit layout verifications.

In traditional integrated circuit (IC) layout verification techniques, parameter values are used to represent different characteristics of an IC chip. For example, electrical components within the IC chip are typically represented by complex polygons, referred to as geometries. The geometries are typically converted into respective rectangles and arranged according to their physical location within the chip. The chip typically comprises a plurality of layers which contain the rectangles. The rectangles are commonly represented by parameter values in the form of coordinates $(x_1, y_1)$ and $(x_2, y_2)$ which are referenced to an established point of origin.

Other types of parameters may be required to perform the layout verifications. For example, when transistor data are generated, parameter values may be extracted from the chip to represent the length, width and the electrical connections of the source gate, drain, and back gate for each transistor. Parameter values may also be extracted from the chip to generate parasitic data which represent the area and perimeter data for overlapping polygons located on different layers of the chip.

All of the types of parameter values are used in layout verifications to determine whether the chip is properly assembled and to confirm that all of the necessary electrical connections have been made between the different components. Many different techniques are known for performing layout verifications. Computer-Aided Design (CAD) tools are frequently used to perform the different IC verifications such as, illustratively, parasitic extractions and design rule checks.

In performing the IC layout verifications, all of the parameter values are stored as files on a disk to reduce system memory requirements. Although the files can be deleted once they are no longer needed, the peak disk requirement remains significant when the IC chips are particularly complex. For example, in a VLSI (very large scale integrated circuit) chip containing a million transistors, the peak disk requirement can be as high as 1 gigabyte without data compression. Because of the sheer number of electrical components within a single VLSI chip, particularly transistor components, VLSI layout verifications are computationally intensive.

In short, the disk requirements for storing the parameter values and the subsequent computations are extreme and can place an enormous strain on the amount of available disk space. Many times, the system performing the verifications runs out of available disk space, causing the system to fail and all accumulated computations to be lost. Since several days can be required to complete the verification of a single VLSI chip, hilure of the system can cause significant delays in the production of the chip.

SUMMARY OF THE INVENTION

In accordance with the present invention, the problem of how to reduce the amount of disk space required for storing the parameter values is overcome by compressing the parameter values used to perform the IC layout verification by computing and storing essential chip information as a function of the interrelationships of the parameter values.

In accordance with one aspect of the invention, each electrical component located within one or more layers of the IC chip is identified by parameter values representing certain types of IC data, e.g., geometric data, parasitic data and transistor data. The parameter values are arranged in an established order based on the physical location of the electrical components within the chip. Parameter values representing data recorded for each specific component are compressed by making differential measurements between parameter values representing data for the specific component currently being recorded and parameter values representing data for a previously recorded component. The resulting compressed or differential values are stored and provide a minimal level of information needed to identify the specific component. The compressed parameter values can then be used to perform the various IC verification processes.

In accordance with another aspect of the invention, layers within the chip containing a plurality of substantially identical geometric data components, e.g., rectangles, are identified. Rectangles having common data attributes (e.g., width, height) are categorized together. Data representing the categorized rectangles are compressed by only encoding the data attributes in the compressed rectangle data.

The effectiveness of these compression transformations can be measured by a compression ratio (the total number of bytes of the uncompressed data to the total number of bytes of compressed data). In particular, the compression ratio for the geometric data can be as high as 20. The compression ratios for the transistor data and parasitic data are typically 4 and 3 respectively. It is thus seen that the present invention facilitates the existing computation environment to accommodate layout verification routines in such a manner that the disk input/output operations are significantly reduced.

DETAILED DESCRIPTION

Figure 1:
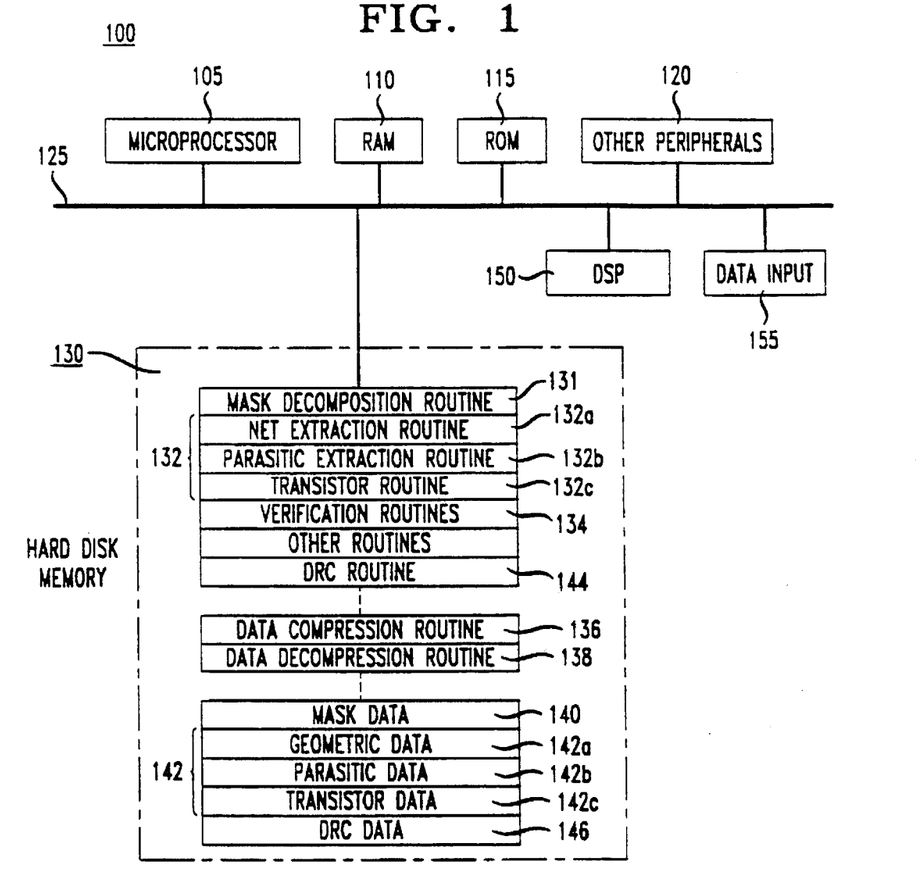
FIG. 1 illustrates a block diagram of a computer system which performs IC layout verification in accordance with the present invention.

FIG. 1 shows a computer system 100 which implements the principles of the present invention. At the heart of the computer system 100 is a microprocessor 105 and various standard peripherals with which it communicates over bus 125. The peripherals include random access memory (RAM) 110, readonly memory (ROM) 115, hard disk memory 130, data input 155, digital signal processor (DSP) 150 and a number of other peripherals indicated at 120.

In general, mask data 140 containing the mask patterns for a particular VLSI chip are retrieved from the hard disk memory 130. The mask data 140 are stored in uncompressed form (typically GDSII string format) and contain all of the relevant circuit data for the chip. The mask data 140 are decomposed into separate disk files by a mask decomposition routine 131. The decomposed mask data are transmitted to extraction routines 132 which extract electrical net data from the mask data which represents the electrical connections between the components contained within the chip. The extracted data are stored in databases 142. The data are received by verification routines 134, illustratively, such as design rule check routines, which verify the data.

Figure 7:
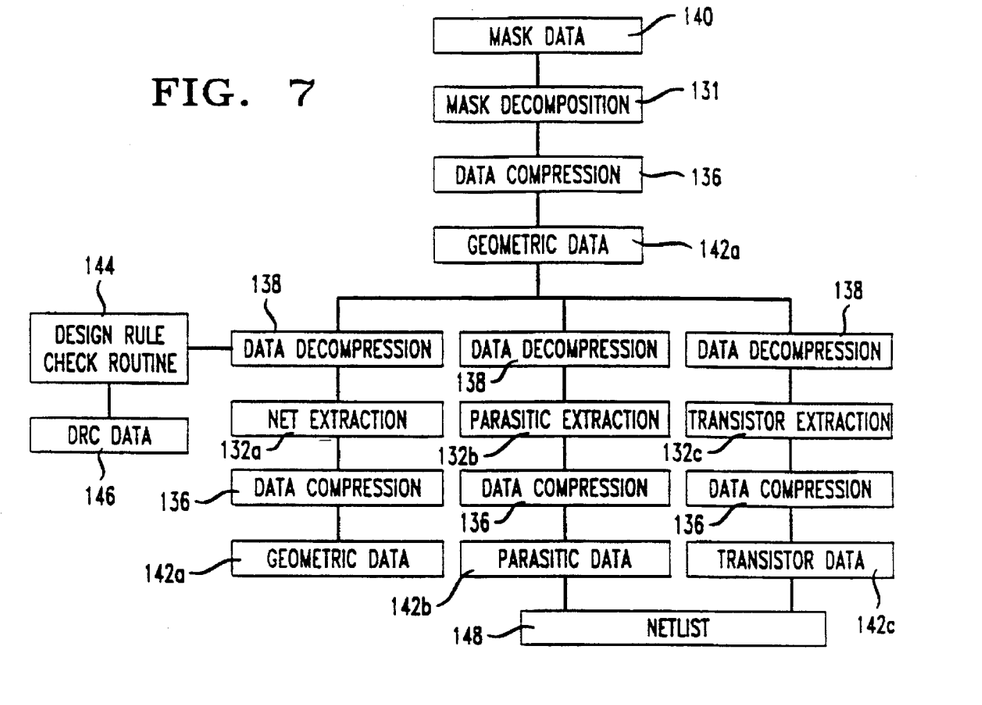
FIG. 7 illustrates a chart representing the flow of data within the computer system of FIG. 1.

Three types of data are stored to perform three types of verification operations which are conventional in the art. These categories of data are geometry data, parasitic data and transistor data and are used to perform net extractions, parasitic extractions and transistor extractions, respectively. FIG. 7 conceptually illustrates how the compressed geometric data, parasitic data and transistor data are generated by the system disclosed in FIG. 1.

As described above, the mask data 140 are received by the mask decomposition routine 131 which identifies the geometric patterns. The data are then compressed by the data compression routine 136 and stored in a geometric database 142a. The compressed geometric data are then decompressed by the data compression routine 138 and provided to one of the extraction routines 132.

The geometric data are verified by performing a net extraction routine 132a which verifies the integrity of the data. The extracted data are then compressed by the data compression routine 136 and stored in the geometric database 142a. The decompressed data may also be received by a design rule check routine 144 which verifies that the circuit patterns on each layer of the chip have proper spacing, width and so-called notch. Any errors found by the design rule check routine are stored in a design rule check (DRC) error database 146. The DRC error database 146 stores the error data in ASCII form.

Parasitic data are extracted from the geometric data by first decompressing the geometric dam as performed by data decompression routine 138. The decompressed data are received by a parasitic extraction routine 132b which combines the geometric data from several layers of the chip to generate data representing the parasitic regions within the chip. The data are received by the data compression routine 136 which compresses the data and stores the compressed data in a parasitic database 142b.

Transistor data are obtained from the geometric data by decompressing the geometric data as performed by data decompression routine 138. The decompressed data are received by a transistor extraction routine 132c which combines the geometric data from up to five of the layers of the chip to generate data representing the transistors contained within the chip. The data are received by the data compression routine 136 which compresses the data and stores the compressed data in a transistor database 142c. Both the parasitic data and the transistor data are verified by running the data through a netlist routine 148 which specifies the electrical connections of the transistor components and the parasitic capacitance of each net.

GENERAL DATA COMPRESSION TRANSFORMATIONS

Figure 4:
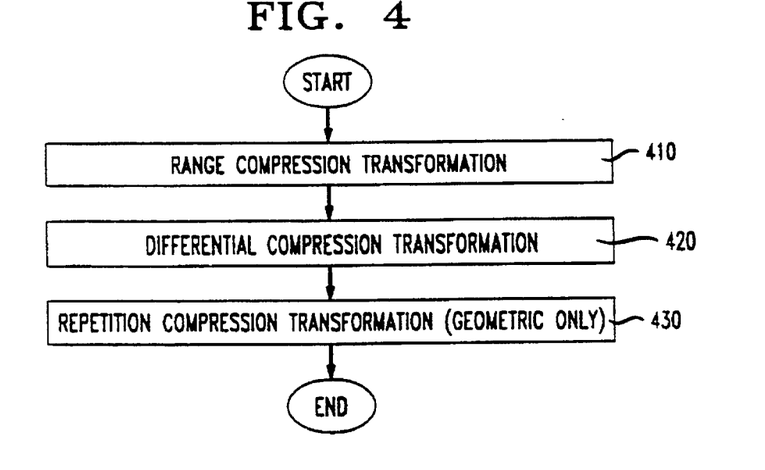
FIG. 4 illustrates a flow chart depicting a method of compressing data used in VLSI layout verification.

In preferred embodiments and as shown in FIG. 4, three transformations may be applied to the data to compress the values of the data used to perform the verification routines. A range compression transformation 410 is applied to the uncompressed data first which reduces the value of the data by a predetermined order of magnitude. For example, geometric data have a resolution of 0.001 μm. Typically, the uncompressed data is scaled down by a litho unit which is equal to 0.05 μm.

A second set of compression transformations which are applied to the data are differential compression transformations 420 which compute differential measurements for each specified component based on parameter values measured for the specific component with respect to parameter values measured for a previously stored component. The differential values provide a minimal amount of information required to retrieve the uncompressed data representing the specific component during layout verification.

A third compression transformation, which may be applied to the geometric data only, is a repetition compression transformation 430. This transformation identifies rectangles contained within a given layer of the chip which are substantially identical and encodes the common data attributes in a compact form, as will be described hereinafter.

MASK DECOMPOSITION ROUTINE

Figure 2:
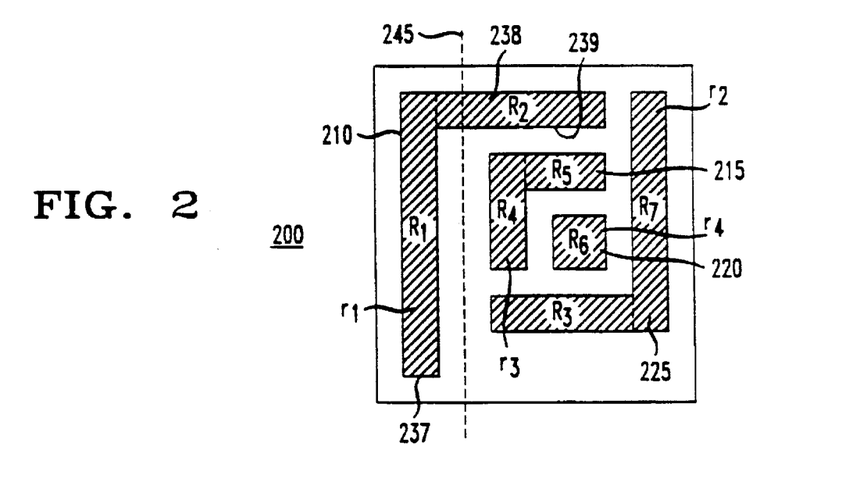
FIG. 2 illustrates a layer of a VLSI chip and the designation of components in the chip in accordance with the present invention.
Figure 3:
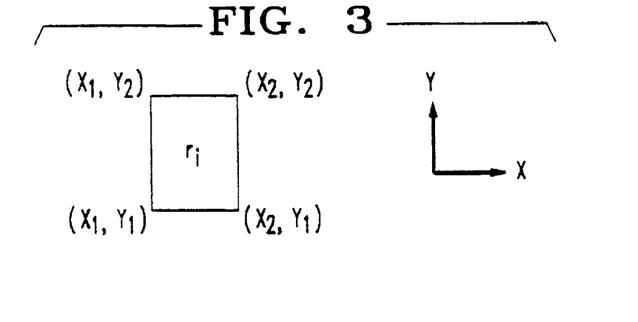
FIG. 3 illustrates a rectangle representing a component of FIG. 2 and its relevant coordinates.

As described above, an important aspect of the mask decomposition routine 131 is the representation of the circuit components in the chip as rectangles and the determination of coordinate data and a region number for all rectangles. FIG. 2, shows an exemplary layer 200 of a VLSI chip. The layer 200 includes a plurality of geometric patterns or polygons, 210, 215, 220, 225 which represent the circuit components contained in the layer of the chip. The polygons are preferably converted into one or more trapezoids, each having two vertical edges and two non-vertical edges which may or may not be parallel. In the preferred embodiment, the non-vertical edges are parallel thereby forming a rectangle. As shown graphically in FIG. 3, there are four distinct coordinates $x_1$, $x_2$, $Y_1$, and $y_2$ and a region number $r_i$ which must be accounted for to adequately record the electrical characteristics of a particular rectangle. Each rectangle is identified by diagonally opposite coordinate pairs, illustratively, the lower left corner coordinate pair $(x_1, y_1)$ and the upper right corner coordinate pair $(x_2, y_2)$. For purposes of explanation, only layers containing components represented by rectangles will be described.

The polygons 210, 215, 220, 225 are decomposed into rectangles by performing well-known Boolean operations to the polygons. The Boolean operations can be conceptually represented by using a scanline method. A vertical scanline 245 is swept across the layer 200 stopping at certain points, namely, the points where an edge or line segment of the polygon begins or ends or where two edges intersect. At any instant in time, the only edges of the layer that are of interest are those that cross the scanline. A polygon can be decomposed into one or more rectangles by correlating the beginning, ending and intersecting points of the line segments with corresponding rectangles. For example, when the scanline 245 sweeps across polygon 210, the scanline locates the end of line segment 237 and the beginning of line segment 239. This information is interpreted to reflect the presence of two rectangles, a vertical rectangle $R_1$, and a horizontal rectangle $R_2$.

The scanline 245 is also used to locate the lower left corner x-axis coordinate ($x_1$) of each rectangle. When the scanline 245 locates $x_1$ of a particular rectangle, the rectangle is assigned a region number $r_i$, also referred to as a net number. Region numbers are assigned to each subsequently connected rectangle in a sequential order. For example, the scanline 245 first locates $x_1$ of the vertical rectangle $R_1$ contained in polygon 210, which is assigned to region $r_1$, and then locates $x_1$ of the horizontal rectangle $R_2$ of polygon 210, which is also assigned to region $r_1$, since rectangles $R_1$, $R_2$ share the same upper edge 238 indicating that they are electrically connected.

Following this methodology, rectangles $R_3$, $R_4$, $R_5$, $R_6$ and $R_7$ are assigned regions $r_2$, $r_3$, $r_3$, $r_4$ and $r_2$ respectively. By assigning the regions in this manner, a predefined order of the rectangles can be established. This ordering property, among others, is used to compress the rectangle data needed for performing the layout verifications as will be described in detail hereinafter.

GEOMETRIC DATA COMPRESSION

For design rule checks, the disk storage requirements are dominated by the amount of geometric data which must be stored. Usually the disk file representation of the polygons is in the form of rectangles as discussed above. Typically, the coordinates and the region number are each represented by a 32-bit integer, i.e., 4 bytes of data, which depicts the location of the rectangle on the layer. Since each rectangle in the chip requires 4 coordinate values and a region number value, 20 bytes of storage are needed to store the data—at least in an uncompressed form. In a typical VLSI chip containing thousands of components, such disk file requirements are burdensome to the system.

In accordance with the present invention, the rectangle data are compressed using the techniques described above and, the following parameters are generated for the rectangle:
1. Length codes as defined below for the coordinates and region number of a given rectangle
2. Position of $x_1$ relative to the position of $x_1$ of the previously stored rectangle, denoted $x'_1$,
3. Position of $y_2$ relative to the position of $y_2$ of the previously stored rectangle, denoted $y'_2$
4. $x_2-x_1$ (width)
5. $y_2-y_1$ (height)
6. Difference between the region number $r_i$ and the region number $r_{i-1}$ of the previously stored rectangle Before storing the data, length codes are defined for each coordinate and region number as a two-bit code representing the minimum number of bytes required to represent that coordinate or region number. The assignment of length codes to the number of bytes that those codes represent—the byte length—is as shown:

| Length Code | Byte Length |
| --- | --- |
| 00 | 0 bytes |
| 01 | 1 byte |
| 10 | 2 bytes |
| 11 | 4 bytes |

By constraining the size of the length codes to 2 bits, only four distinct byte lengths can be represented. In this case, the four byte lengths are 0, 1, 2 and 4 bytes. If 3 bytes are required to represent an uncompressed coordinate value or region number, the length code for 4 bytes is used. Different length code assignment schemes can be used, depending on the characteristics of the data. Since there are 4 coordinates and 1 region number for each rectangle, 10 bits or 2 bytes are required to store the length codes.

The length codes are used by the decompression routines to retrieve the uncompressed data. The length codes are stored in an arbitrary, but fixed order, e.g., $y_1$, $x_1$, $x_2$, $y_2$, $r_i$.

Figure 5:
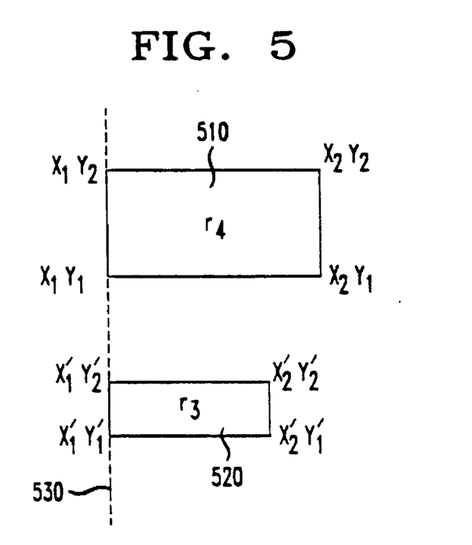
FIG. 5 illustrates a portion of the layer of FIG. 2 in which two rectangles have been ordered with respect to a scan line.

An example of the compression technique is now discussed with reference to FIG. 5. which illustrates two rectangles 510, 520 which may be contained in a layer of a VLSI chip. If the scanline 530 is swept across the layer in a direction from left to right, the scanline 530 locates the bottom rectangle 520 and the top rectangle 510 concurrently. Since the $y_1$ coordinate of the bottom rectangle 520 is of a lesser value than the $y_1$ coordinate of the top rectangle 510, the data for the bottom rectangle 520 is stored first. Next, the data for the top rectangle 510 is determined with reference to the bottom rectangle 520 as the previously stored rectangle.

A range compression transformation is applied to the coordinate data for the top rectangle 510 which scales down the value of the coordinate data by a predetermined order of magnitude. Next differential compression transformations are applied to the parameter values representing each coordinate of the top rectangle 510, which are determined as a function of the parameter values of corresponding coordinates of the previously stored rectangle 520. More specifically, a differential value is obtained by subtracting the uncompressed data value for the previously recorded rectangle from the uncompressed data value for the currently stored rectangle. Typically, the differential value for a given parameter requires 0 or 1 byte of storage since the parameter values of the coordinates for the currently stored rectangle are measured with respect to the parameter values of corresponding coordinates for a previously stored rectangle which is in close proximity, thereby typically resulting in small differential values. The differential value is later retrieved to decompress the rectangle data. Data for the previously stored rectangle are retained and modified by the differential values to obtain the parameter values for the current rectangle of interest.

In accordance with the above description, the compressed or differential values representing the data for the top rectangle 510 are determined. The value of the $x_1$ coordinate for each rectangle 510, 520 is the same. Therefore the difference in value of the $x_1$ and $x'_1$ coordinates, also referred to as the slice, is 0 and 0 bytes of storage are required. The slice indicates the alignment of the left sides of the two consecutive rectangles. The difference in the value of the $y_1$ and $y'_2$ coordinates of the rectangles 510, 520, also referred to as the gap, is a relatively small value since the top rectangle 510 is in relatively close proximity to the bottom rectangle 520. The gap typically represents the minimum spacing between two consecutive rectangles. It illustratively requires 1 byte of storage. In general, the size of each value is relatively small. Therefore, the value representing the distance between either $x_1$ and $x'_1$ or $y_1$ and $y'_1$ generally requires only 0 or 1 byte of storage.

In general, for a given rectangle, one pair of opposite sides of the rectangle is usually longer than the other pair of opposite sides. Based on this observation, the parameter value $(x_2-x_1)$ usually requires 1 byte of storage and the parameter value $(y_2-y_1)$ usually requires at least 2 bytes (3 bytes on average) of storage or vice versa. In the present example, the top rectangle 510 is oriented such that the shorter pair of sides are parallel to the y axis and the longer pair of sides are parallel to the x axis. Therefore, the value of $(x_2-x_1)$ requires 2 bytes of storage and the value of $(y_2-y_1)$ requires 1 byte of storage.

In general, the difference between the parameter values representing the region numbers for the two rectangles usually requires 0 bytes or 1 byte of storage since the rectangles are for the most part stored in a sequential order as determined by the region numbers. The differential value representing the region number is obtained by determining the difference in value between the region number of the currently stored rectangle and the region number for the previously stored rectangle and further by subtracting one from the differential value. In the present example, the bottom rectangle 520 is in region $r_3$ and the top rectangle 510 is in region $r_4$. Thus, the parameter value representing the region number for the top rectangle requires 0 bytes of storage. As shown below, the compressed data for rectangle 510 requires approximately 7 bytes of storage as compared to the 20 bytes of storage required to store the data in the uncompressed form.

| Rectangle record #n | No. Bytes |
|---|---|
| Length Codes | 2 |
| $x_1$ (relative to $x'_1$) | 0 |
| $y_1$ (relative to $y'_2$) | 1 |
| $x_2 - x_1$ (width) | 1 |
| $y_2 - y_1$ (height) | 3 |
| $r_i$ (relative to $r_{i-1}$) | 0 |
| Total | 7 |

In accordance with an aspect of the present invention, a repetition compression transformation may additionally be applied to the rectangle data for a given layer if the layer contains a large number of substantially identical rectangles. In such a case, a table is constructed which comprises categories of data attributes such as, for example, width, height and the size of the gap between rectangles.

Once the layer has been completely scanned and occurrence counts of each distinct data attribute have been accumulated, the layer is scanned a second time. For each data attribute category, the k most frequently occurring values, e.g., 4, are encoded as rank codes. Each rank code is a two bit number that can conveniently be placed in the length code field. The rank codes are as follows:

| Rank Code | Occurrence No. |
|---|---|
| 00 | 1 |
| 01 | 2 |
| 10 | 3 |
| 11 | 4 |

As each rectangle is scanned a second time, the rank codes for each rectangle are determined. The rank codes, in general, are similar to the length codes described above. However, the rank code includes an additional header comprising three bits—a width bit, a height bit and a gap bit. When any one of the header bits is set to one, length code is replaced by the rank codes which indicates the particular attribute category, and the frequency of the occurrence of its value. If the rectangle being recorded has not been classified into one of the attribute categories, the width bit, the height bit and the gap size bit are each set to zero and the data for the rectangle is recorded as described above.

For those rectangles whose data are qualified in all three attribute categories, the compressed data required to store the rectangle is 2 bytes as shown below:

| Rectangle Record #n | No. Bytes |
|---|---|
| Length code | 2 |
| $x_1$ (relative to $x_1$.) | 0 |
| $y_2$ (relative to $y_2$.) | 0 |
| $x_2 - x_1$ (width) | 0 |
| $y_2 - y_1$ (length) | 0 |
| $r_i$ (relative to $r_{i-1}$) | 0 |
| Total | 2 |

Figure 8:
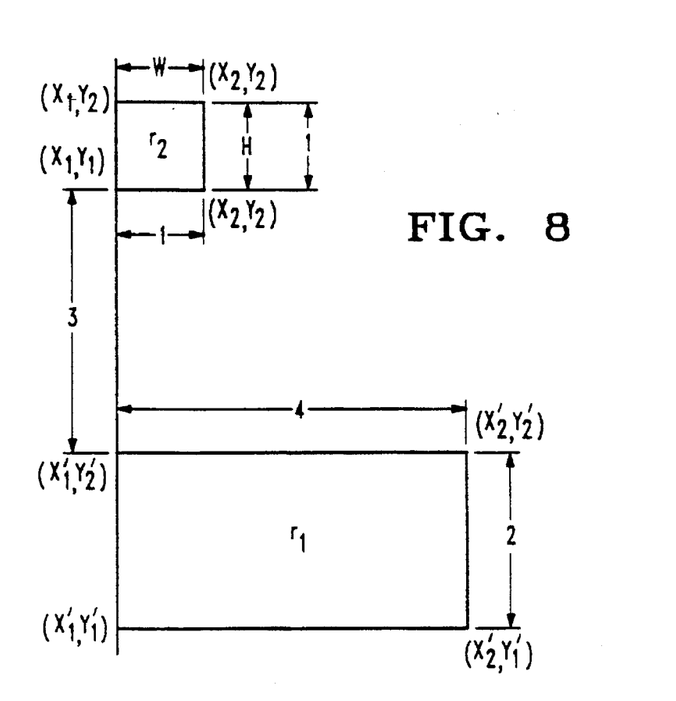
FIG. 8 illustrates a pair of consecutive rectangles contained within a layer of a VLSI chip.

The above-described compression transformations may be more fully appreciated with reference to the following example. Two rectangles $R_1$, $R_2$ are located by a scanline as illustrated in FIG. 8. Rectangle $R_1$ has dimensions of 4.0 μm×2.0 μm and rectangle $R_2$ has dimensions 1.0 μm×1.0 μm. It is assumed that the minimum resolution unit is 0.001 μm. The following are the uncompressed coordinate values for $R_1$ and $R_2$:

| $R_1$ | $R_2$ |
|---|---|
| $x'_1 = 13,428,500$ | $x_1 = 13,428,500$ |
| $x'_2 = 13,432,500$ | $x_2 = 13,429,500$ |
| $y'_1 = 572,750$ | $y_1 = 577,750$ |
| $y'_2 = 574,750$ | $y_2 = 578,750$ |
| net = 1 | net = 2 |

A range compression transformation is applied to the data for both $R_1$ and $R_2$ by dividing each of the coordinate values by the litho unit, i.e., 50, which produces the following values:

| $R_1$ | $R_2$ |
|---|---|
| $x'_1 = 268,570$ | $x_1 = 268,570$ |
| $x'_2 = 268,650$ | $x_2 = 268,590$ |
| $y'_1 = 11,455$ | $y_1 = 11,555$ |
| $y'_2 = 11,495$ | $y_2 = 11,575$ |

Next, differential compression transformations are applied to the data for $R_2$ as a function of the data for $R_1$ which is defined to be the previously stored record. The differential compression transformations comprise five separate transformations which include a width transformation, a height transformation, a slice transformation, a gap transformation, and a net transformation. The width transformation $x_2$(new) is performed by determining $x_2-x_1$ as follows:

$$x_2(\text{new})=x_2-x_1=268,590-268,570=20$$

The height transformation $y_2$(new) is performed by determining $y_2-y_1$ as follows:

$$y_2(\text{new})=y_2-y_1=11,575-11,555=20$$

The slice transformation $x_1$(new) is performed by determining $x_1-x'_1$ as follows:

$$x_1(\text{new})=x_1-x'_1=268,570-268,570=0$$

The gap transformation $y_1$(new) is performed by determining $y_1-y'_2$ as follows:

$$y_1(\text{new})=y_1-y'_2=11,555-11,495=60$$

The net transformation net(new) is performed by determining $R_2-R_1-1$ as follows:

net(new)=net($R_2$)−net ($R_1$)−1=2−1−1=0

The data produced from the range compression transformation and the differential compression transformations can be represented using the length codes defined above in the following manner:

|  | $y_1$ | 34 | 56 | 78 |  |
|---|---|---|---|---|---|
| 1st byte | 01 | 10 | 00 | 00 |  |
|  | $x_1$ | $x_2$ | $y_2$ | net |  |
| 2nd byte | 00 | 01 | 01 | 00 |  |
| 3rd byte |  | 60 |  |  | (value of $y_1$) |
| 4th byte |  | 20 |  |  | (value of $x_2$) |
| 5th byte |  | 20 |  |  | (value of $y_2$) |

The first two bytes of data include the fields for $y_1$, $x_1$, $x_2$, $y_2$ and the net and bits 3–8 of the first bytes are used to record additional information as will be described hereinafter. The third bit of the first byte is set to "1" to indicate that the range compression transformation has been performed. Likewise the fields for $y_1$, $x_2$ and $y_2$ have been assigned length code "01" indicating that each field contains one byte of information and the length code for field $x_1$ is "00" indicating the field contains zero bytes of information. The third, fourth and fifth bytes contain the data values generated by the width transformation, height transformation and gap transformation.

Assuming that the layer containing rectangles $R_1$, $R_2$ contains a large number of substantially identical rectangles, a repetition compression transformation is performed. Continuing with the example, the values representing the gap ($y_1$), width ($x_2$) and height ($y_2$) for each rectangle contained in the layer are pooled together and the four most frequently occurring values are identified. It is assumed that the value 20 is the most frequently occurring value as designated by rank code 00 and that the value 60 is the fourth most frequently occurring value as designated by rank code 11. As such, the values for $x_1$, $x_2$, $y_1$ and $y_2$ can be represented as follows:

| $x_1 = 0$ | $y_1 = \#4 = 11$ |
|---|---|
| $x_2 = \#1 = 00$ | $y_2 = \#1 = 00$ |

Using the compressed values derived from the repetition compression transformation, the data representing $R_2$ can be reduced to 2 bytes as follows:

|  | $y_1$ | 34 | 56 | 78 |
|---|---|---|---|---|
| 1st byte | 11 | 11 | 11 | 00 |
|  | $x_1$ | $x_2$ | $y_2$ | net |
| 2nd byte | 00 | 00 | 00 | 00 |

Bit 3 as before indicates that the range compression transformation has been performed. Bits 4–6 have been designated as 1 to indicate that the fields $y_1$, $x_2$ and $y_2$ have one of the four most frequently occurring values and that the rank codes assigned to each of these fields represent which of the four most frequent values it is assigned. The $y_1$ field is assigned the rank code 11 to indicate that it represents the fourth most frequently occurring value. The $x_2$ and $Y_2$ fields are assigned the rank code 00 to indicate that they represent the most frequently occurring value.

Since the second byte of information is represented by a string of zeros, the seventh bit of the first byte is designated "1" and the second byte can be eliminated thereby reducing the dam representing rectangle $R_2$ to one byte of information as follows:

|  | $y_1$ | 34 | 56 | 78 |
|---|---|---|---|---|
| 1st byte | 11 | 11 | 11 | 10 |

When a layout verification routine is performed, the single byte of information is used to retrieve the decompressed data representing rectangle $R_2$. Conceptually, the following analysis is performed to decompress the data. It is first noted that bit 7 is equal to 1 indicating that the second byte of information is a string of zeros which is restored. Bit 4 is equal to 1 indicating that the $y_1$ field contains one of the four most frequent values. The $y_1$ field is equal to 11 indicating that it is equal to the fourth most frequent value which is 60. Bit 5 is equal to 1 indicating that the $x_2$ field is equal to one of the four most frequently occurring values. The $x_2$ field is equal to 00 indicating that it is equal to the most frequently occurring value which is 20. Likewise bit 6 is equal to 1 indicating that the $y_2$ field is equal to one of the four most frequently occurring values. The $y_2$ field is equal to 00 indicating that it is equal to 20. Bit 3 is equal to 1 indicating that the values have been compressed and must be multiplied by the litho unit.

The $y_1$ field is 60 litho units greater than the previous record $R_1$ (11,495) resulting in the value 11,555 which is multiplied by the litho unit to yield 577,750. The $x_2$ field is 20 litho units greater than the previous record $R_1$ (268,570) resulting in the value 268,590 which is multiplied by the litho unit to yield 13,429,500. The $y_2$ field is 20 litho units greater than the previous record $R_1$ (11,555) resulting in the value 11,575 which is multiplied by the litho unit to yield 578,750. The $x_1$ field is equal to 00 indicating that it is the same value as the previous record $R_1$ which is equal to 13,428,500. The net ($R_2$), as indicated by the net length code 00, is exactly one more than that of $R_1$. As a result of the decompression the following uncompressed values are derived for rectangle $R_2$:

| $x_1 = 13,428,500$ |
|---|
| $x_2 = 13,429,500$ |
| $y_1 = 577,750$ |
| $y_2 = 578,750$ |
| net = 2 |

PARASITIC DATA COMPRESSION

Figure 6:
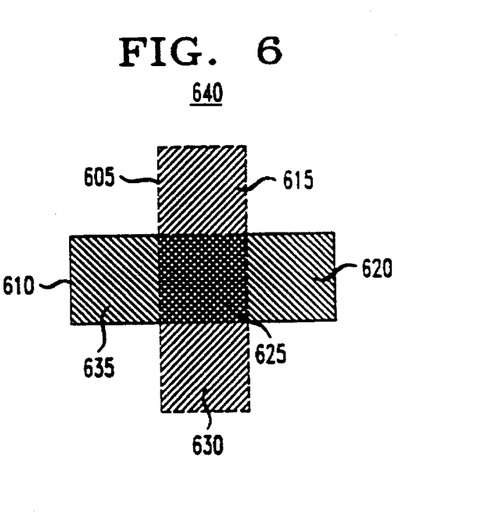
FIG. 6 illustrates parasitic data derived by an area and perimeter extraction of a VLSI chip in accordance with the present invention.

In performing parasitic extractions, parameter values representing the areas and perimeters of regions from different layers are extracted from the chip and a record is developed representing how the regions overlap. Referring to FIG. 6, there are shown two regions 605, 610 of a VLSI chip. Each layer is arbitrarily assigned a different color. However, the layers can be given any type of designation for distinguishing one layer from another. For purposes of explanation, the layer that contains region 605 is assigned blue and the layer that contains region 610 is assigned red. As the regions overlap, more regions are created which each bear a distinct composite color. A region located in a particular layer is assigned the color of the layer and a region number. If the region is located in more than one layer, the region is assigned the color designated for each of those layers and their region numbers. Thus FIG. 6 shows regions can be assigned (red, 635) (red, 620) (blue, 615) (blue, 630) and (red-blue, 625).

The overlapping blue and red layers form five distinct regions 615, 620, 625, 630, and 635. Region 625 is included in both the blue layer and the red layer. Parameter values representing the area and perimeter data are generated for each region. In uncompressed form, the area and perimeter data include color, so-called nets or electrical connections, area, region number, perimeter amount and perimeter color.

For example, the parasitic data for region 615 is determined in the following manner. The color of region 615 is blue and the number of distinct perimeter regions bordering region 615 is two. The perimeter regions are determined by identifying the regions which border region 615 and identifying the layer in which each bordering region is located. Region 615 is bordered by a first perimeter region comprising colorless region 640 in which the perimeter amount equals 3 and the perimeter color is colorless. A second perimeter region comprises one red-blue region 623 in which the perimeter amount equals one and the perimeter color is red-blue. The area of region 615 is one (1 unit width ×1 unit length) and the region number is 615.

Typically the parasitic data are determined for a composite region such as region 625. The color of region 625 is red-blue and includes region number 610 (red) and region number 605 (blue). There are two distinct perimeter colors-two units of blue perimeters corresponding to 615, 630 and two units of red perimeters corresponding to 635, 620. In uncompressed form, 24 bytes of data are required to store the parasitic information. For region 625, the 24 bytes of data comprise 1 byte for color, 4 bytes for area, 1 byte for the number of perimeters, 4 bytes each for the two region numbers, 1 byte each for the two perimeter colors and 4 bytes each for the two perimeter amounts.

In accordance with the present invention, parameter values representing the following parasitic data are generated:
1. Length codes for parameter values listed below
2. Region color
3. Number of perimeter records relative to the previously stored region of the same color
4. Area of the region relative to the previously stored region of the same color
5. Nets relative to the previously stored region of the same color
6. Perimeter amount relative to the previously stored region of the same color
7. Perimeter color relative to the previously stored region of the same color The parameter values representing the area and perimeter data for a particular region are compared to the parameter values representing the area and perimeter data for a previously stored region which is the same color as the particular region. More specifically, a differential value is obtained by subtracting the data value for the previously stored region from the data value for the currently stored region. Continuing with the example, the length codes for region 625 are represented by a two bit number and generated to indicate the number of bytes in uncompressed form required to store the data items 4, 5, 6 above. Since there are 5 items of data, 10 bits of data are generated. Item 1 is not compressed so no length code is required. The data storage for items 3 and 7 are at most 1 byte each. Therefore, the length codes for items 3 and 7 are each 1 bit. Since item 3 is comprised of one record and item 7 is comprised of two records a 3 bit length code can be generated for items 3 and 7. As a result, the length code required for items 2–7 is 13 bits or 2 bytes. The length codes are used by the netlist routine 148 to identify the corresponding uncompressed data generated by parasitic extraction routine 132b.

A parameter value representing that the color of region 625 is red-blue is stored uncompressed as 1 byte of data. In determining the parameter value representing the number of perimeter regions relative to the previously stored region of the same color, the reduced length bit is used to indicate whether the number of perimeter regions associated with the current region is the same as that of the previously recorded region of the same color. If the number of perimeter regions is not the same, the bit is set to 1 and the number of perimeter regions is stored after the color parameter value in 1 byte of data. If the number of perimeter regions is the same, the bit is set to 0 and nothing is stored for the number of perimeter regions. Therefore, storing the number of perimeter regions generally requires 0 or 1 bytes.

The parameter value representing the area is generated by comparing the area of the region to the relative area of the previously stored region of the same color. Usually the relative area is 0, since the areas of the regions tend to be somewhat uniform. Thus, 0 bytes of storage are usually required to store the relative area. If not, the range compression transformation can be applied to the area data to reduce the magnitude of the data by the value of $(litho)^2$. The parameter value representing the number of nets or layers associated with the regions is directly related to the number of active colors assigned to a particular region. Typically a region comprises two layers.

The parameter value representing the perimeter amount indicates the number of regions located in the same layer which border region 625 and is a function of the number of perimeter regions. A perimeter amount exists for each perimeter region. Likewise a parameter value representing the perimeter color of the layer having a specific perimeter amount is also generated. A range compression transformation can be applied to the perimeter amount data to reduce the magnitude of the perimeter amount data by the value of the litho unit.

As shown below, the compressed data required to store the parasitic data for an average region is generally 8 bytes, which is one third the size of the uncompressed data:

| Parasitic Data | No. Bytes |
| --- | --- |
| Length codes | 2 |
| Color | 1 |
| No. perimeter regions (relative to previously stored region of same color) | 0 |
| Area (relative to previously stored region of same color) | 1 |
| Nets (relative to previously stored region of same color) | 2 |
| Perimeter Amount (relative to previously stored region of same color) | 2 |
| Perimeter Color (relative to previously stored region of same color) | 0 |
| Total | 8 |

TRANSISTOR DATA COMPRESSION

In transistor netlist extraction, transistor data are generated to determine connectivity between transistors and to verify that there are no electrical open circuits or short circuits. The transistors are assigned transistor numbers in a sequential order. Data for each transistor are generated which include transistor number, transistor type, terminal nets, i.e., source, gate, drain and back gate, and the length and width of the transistor. Each item of data is represented by a parameter value comprising a 32 bit integer, i.e., 4 bytes. Since eight parameter values are generated and stored, the amount of storage required in uncompressed form is 32 bytes.

In accordance with the present invention, the following transistor data are generated:
1. Length codes for each item of transistor data
2. Transistor number relative to previously stored transistor
3. Transistor type
4. Source net relative to previously stored transistor
5. Gate net relative to previously stored transistor
6. Drain net relative to previously stored transistor
7. Back gate relative to previously stored transistor of same type
8. Length relative to previously stored transistor of same type
9. Width relative to previously stored transistor of same type Data compression is performed by comparing the data generated for a particular transistor to the data generated for a previously stored transistor. More specifically, a differential value is obtained by subtracting the uncompressed data value for the previously stored transistor from the uncompressed data value for the currently stored transistor. Length codes represented by a two bit number are generated for each item of transistor length code data. Since there are eight items of transistor data, 16 bits or 2 bytes of data are required to store the transistor length code data. The transistor length code data are used by the netlist routine 148 to present the corresponding uncompressed data. A parameter value representing the transistor number is generated by comparing the transistor number of the current transistor to the transistor number for the previously stored transistor. The parameter value generally requires 0 bytes of storage since the transistors are stored in sequential order and the transistor number is incremented by one prior to storing the data for a subsequent transistor.

A parameter value representing the transistor type is generated and requires 0.5 bytes of storage on average since the transistor is either an n-type or p-type transistor and there are usually a similar number of n-type and p-type transistors contained in the chip. A parameter value representing the source net of the currently stored transistor relative to the source net of the previously stored transistor generally requires 1.5 bytes of storage. A parameter value representing the gate net stored transistor relative to the gate net of the previously stored transistor generally requires 2 bytes of storage. A parameter value representing the drain net of the currently stored transistor relative to the drain net of the previously stored transistor generally requires 1.5 bytes of storage. In general, the parameter values representing each of the source net, gate net, and drain net requires either 1 or 2 bytes of storage since the offset with respect to the previously stored transistor is usually relatively small.

A parameter value representing the back gate of the currently stored transistor relative to the back gate of the previously stored transistor is generally equal to 0 and requires 0 bytes of storage since the back gates are typically connected to the same power net. The length and width of the currently stored transistor relative to the length and width of the previously stored transistor parameter values representing is generally equal to 0 bytes since the transistors are typically similarly sized. A range compression transformation can be applied to the length and width data to reduce the magnitude of the data by the value of the litho unit.

As shown below, the parameter values generated to represent data for an average transistor require 7.5 bytes of storage which is 25% of the amount of data stored in uncompressed form:

| Transistor Data | No. Bytes |
| --- | --- |
| Encoding length | 2 |
| Transistor number (relative to previously stored transistor) | 0 |
| Transistor type | 0.5 |
| Source net (relative to previously stored transistor) | 1.5 |
| Gate net (relative to previously stored transistor) | 2 |
| Drain net (relative to previously stored transistor) | 1.5 |
| Back gate (relative to previously stored transistor of same type) | 0 |
| Length (relative to previously stored transistor of same type) | 0 |
| Width (relative to previously stored transistor of same type) | 0 |
| Total | 7.5 |

The foregoing merely illustrates the principles of the invention and it will thus be appreciated that those skilled in the art will be able to devise numerous alternative arrangements which, although not explicitly described herein, embody the principles of the invention and are within its scope and spirit. For example, in the geometric data compression, the arrangement of the length code fields can be modified so that the second byte of compressed data contains a string of zeros as shown in the above example. Also, the data attributes representing the width and height can be combined into a single attribute referred to as shape. As such, up to 16 of the most frequently occurring shapes can be recorded in the four bit field. It is to be further understood that the repetition compression can be performed with no additional data scanning since most scanning methods require two scannings of the data.

We claim:

1. A method of compressing data used in IC layout verifications of an IC chip comprising:

a) identifying each circuit component from each layer of the IC chip;

b) applying a range compression transformation to uncompressed data which reduces the value of the data by a predetermined order of magnitude;

c) arranging each circuit component in an established order based on the physical location of the circuit component within the IC chip;

d) identifying predetermined parameters for each component;

e) performing a differential measurement to determine the difference in value of the parameters for a pair of components in successive order, said differential measurement resulting in a compressed data representation of the parameter values for a second component relative to a first component, said first and second components comprising the pair of components, said second component being a component for which the compressed data representation is currently being recorded and the first component being a component for which a compressed data representation has previously been recorded, said compressed data representation representing the minimal amount of information required to retrieve the parameter values for the second component, said data representation containing relational information for the pair of components, said differential measurement acting as a mechanism for compressing the data representing the circuit components;

f) identifying rectangles contained within a given layer of the chip which are substantially identical;

g) encoding common data attributes in a compact form;

h) storing the compressed data representation for the second component; and i) repeating steps e) and h) for each successive pair of components contained in the IC chip.

2. The method according to claim 1 wherein said predetermined parameters represent geometric data describing each component in the chip.

3. The method according to claim 2 wherein each component is represented by at least one rectangle and said identifying step further comprises:

identifying coordinate data for each component within the chip representing each rectangle.

4. The method according to claim 3 wherein said coordinate data for a given rectangle comprises diagonally opposite coordinate pairs.

5. The method according to claim 1 wherein said predetermined parameters represent parasitic data.

6. The method according to claim 1 wherein said predetermined parameters represent transistor data.

7. The method according to claim 1 further comprising the step of scaling down each parameter value by a predetermined order of magnitude.

* * * * *